(12) United States Patent
Tran et al.

(10) Patent No.: US 7,972,023 B2
(45) Date of Patent: Jul. 5, 2011

(54) LAMP-COVER STRUCTURE CONTAINING LUMINESCENT MATERIAL

(75) Inventors: Nguyen The Tran, Garden Grove, CA (US); Yongzhi He, Irvine, CA (US); Frank Shi, Irvine, CA (US)

(73) Assignee: Nepes LED Corporation, Chungcheongbuk-do (KR)

( * ) Notice: Subject to any disclaimer, the term of this patent is extended or adjusted under 35 U.S.C. 154(b) by 169 days.

(21) Appl. No.: 12/381,407

(22) Filed: Mar. 10, 2009

(65) Prior Publication Data

US 2010/0232133 A1 Sep. 16, 2010

(51) Int. Cl.
*F21V 9/16* (2006.01)
*F21V 5/00* (2006.01)

(52) U.S. Cl. ............................ 362/84; 362/268; 362/331

(58) Field of Classification Search .................... 362/84, 362/231, 268, 331, 318, 336, 335, 329, 311.02, 362/311.06, 311.1
See application file for complete search history.

(56) References Cited

U.S. PATENT DOCUMENTS

| | | | | |
|---|---|---|---|---|
| 5,506,762 | A * | 4/1996 | Ziegler et al. | 362/202 |
| 7,582,914 | B2 * | 9/2009 | Lin | 257/98 |
| 7,753,573 | B2 * | 7/2010 | Yatsuda et al. | 362/539 |
| 2007/0241357 | A1 * | 10/2007 | Yan | 257/98 |
| 2010/0165599 | A1 * | 7/2010 | Allen | 362/84 |

* cited by examiner

*Primary Examiner* — Jong-Suk (James) Lee
*Assistant Examiner* — Peggy A. Neils
(74) *Attorney, Agent, or Firm* — Ladas & Parry LLP

(57) ABSTRACT

An LED lamp cover structure containing luminescent material and its fabrication methods are described. The LED lamp cover is comprised of a first lens cap providing the outer surface of the lamp cover, a second lens cap providing the inner surface of the lamp cover, and an encapsulating layer sandwiched between the lens cap providing the outer surface of the lamp cover and the lens cap providing the inner surface of the lamp cover, which is mixed with luminescent material for wavelength conversion.

8 Claims, 1 Drawing Sheet

LAMP-COVER STRUCTURE CONTAINING LUMINESCENT MATERIAL

BACKGROUND OF INVENTION

1. Field of the Invention

This invention discloses an LED (light emitting diode) lamp cover structure containing luminescent material and the method of making the same.

2. Background Art

LED devices can emit different colors of light. For producing white light, various colors can be combined. The common way for producing white light is to use phosphor luminescent materials that absorb blue LED-emanated light and emit yellow or greenish yellow light. In conventional phosphor-based white LED package, phosphor material is mixed with silicone encapsulation material and dispended in the cup or coated on the LED chip. These methods of applying phosphor luminescent material could result in high light loss due to backwardly propagation of phosphor-emitted light into LED chip and could be associated with binning issues. Thus, they have a low fabrication yield and a high cost per lumen.

SUMMARY OF INVENTION

The present invention relates to an LED lamp cover containing luminescent material for providing different colors of light as well as white light and the method of making the same. The LED lamp cover is comprised of a first lens cap providing the outer surface of the lamp cover, a second lens cap providing the inner surface of the lamp cover, and an encapsulating layer sandwiched between the first lens cap and the second lens cap. The encapsulating material for making the encapsulating layer is mixed with luminescent material for wavelength conversion.

The encapsulating material with luminescent material is dispensed into the cavity of the first lens cap followed by placing the second lens cap into the cavity containing the encapsulating material. The entire unit is then placed in a heat chamber at an appropriate temperature so that the encapsulating material is cured and bonded to the lens caps.

The LED lamp cover is combined with at least one blue LED to generate different colors of light, including white light.

DETAILED DESCRIPTION OF THE INVENTION

This invention discloses the LED lamp cover structure containing luminescent material and the method of making the LED lamp cover structure. The LED lamp cover is combined with at least one color LED such as blue LED to generate white light or light at different colors.

Figure 1:
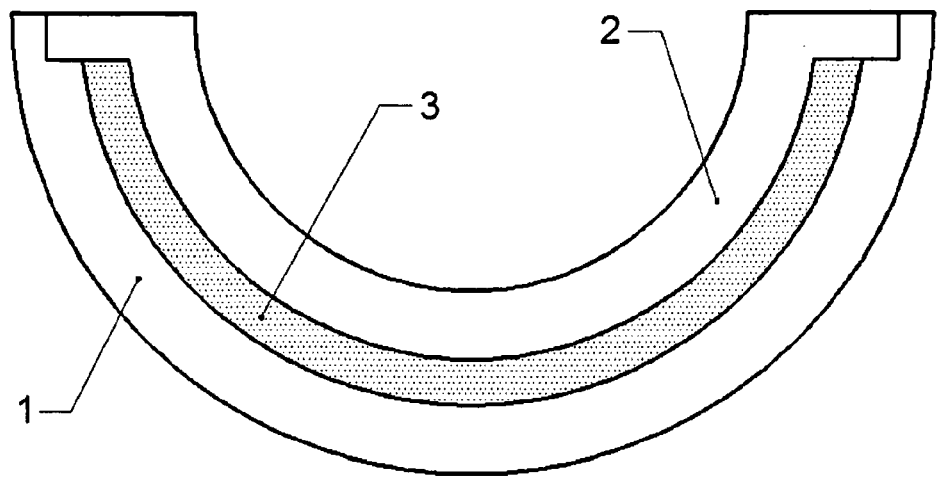
FIG. 1 is a schematic drawing of a cross-sectional view of the LED lamp cover as an example to illustrating the invention

As shown in FIG. 1, the lamp cover is comprised of a first lens cap 1 providing the outer surface of the lamp cover, a second lens cap 2 providing the inner surface of the lamp cover, and a wavelength-conversion layer 3 containing luminescent material for wavelength conversion and being sandwiched between the lens cap 1 and the lens cap 2. The shape and geometries of the wavelength conversion layer are based on the dimensions of the two lens caps.

The lens cap 1 and the lens cap 2 have concave-convex shapes as shown in FIG. 1 and have a circular base resulting in a shape like a portion of spherical shell. The lens cap 1 and the lens cap 2 can also have other shapes such as rectangular or square box.

Figure 2:
FIGS. 2a-d illustrate the method of making the LED lamp cover of the invention
Figure 2:
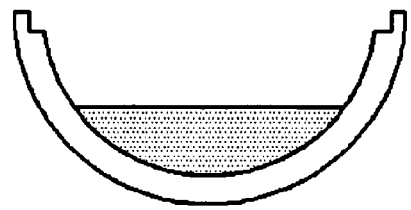
Figure 2:
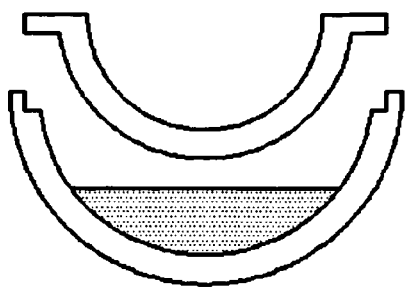
Figure 2:
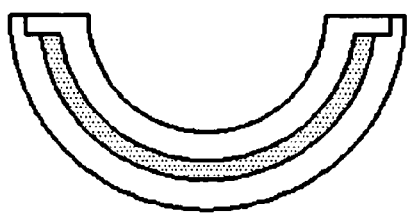

The LED lamp cover is fabricated as follows: 1) providing the first lens cap 1 with a concave surface and a convex surface (FIG. 2a); 2) dispensing a proper amount of a binder material mixed with luminescent material into the concave area of the first lens cap 1 to form the wavelength conversion layer 3 later (FIG. 2b); 3) placing the second lens cap 2 into the concave area of the first lens cap 1 with the wavelength conversion layer 3 sandwiched between the concave surface of the first lens cap 1 and the convex surface of the second lens cap 2 (FIG. 2c-d); 4) curing the binder material containing the luminescent material by using heating or UV radiation.

Alternatively, the LED lamp cover is fabricated as follows: 1) the first lens cap 1 with a concave surface and a convex surface is provided (FIG. 2a); 2) the second lens cap 2 is provided and placed into the concave area of the first lens cap 1 with an air space sandwiched between the concave surface of the first lens cap 1 and the convex surface of the second lens cap 2; 3) the second lens cap 2 is mechanically fixed to the first lens cap 1 by a mechanical design or using glue; 4) a proper amount of a binder material mixed with luminescent material is dispensed into the air space to fill the air space; 5) the binder material containing the luminescent material is cured by using heating or UV radiation to form the wavelength conversion layer 3.

The luminescent material in the lamp cover can be a phosphor material or combined phosphor materials that emit green, and/or yellow, and/or red light as they are activated by excitation light.

The lamp cover can be used to cover a light emitting device emitting light at an excitation wavelength. In such a case, the luminescent material fluoresces at the excitation wavelength, such that when combined with the residue excitation light from the light emitting device, a white light can be produced. For example, the light emitting device is a blue LED with an emitting wavelength ranging from 450 nm to 480 nm, while the luminescent material emits at a yellow peaked wavelength under the excitation of the blue light, such that the yellow light combined with the residue blue one creates white light. It is also possible that the luminescent material fluoresces with multiple excited wavelengths at the excitation wavelength, such that when all the excited emissions with multiple wavelengths are mixed together, a white light is produced. For example, the light emitting device is a near-UV LED with an emitting wavelength ranging from 380 nm to 450 nm, while the luminescent material emits at blue, green, and red peaked wavelength under the excitation of the near-UV light, such that the RGB light mixed together creates a white light.

What is claimed is:

1. A lamp cover structure containing luminescent material, comprising:
   a first lens cap providing an outer surface of the lamp cover;
   a second lens cap providing an inner surface of the lamp cover;
   a encapsulating layer sandwiched between the said first lens cap and the second lens cap, wherein the encapsulating layer is silicone polymer mixed with luminescent material; and
   the second lens cap including mechanical supporters protruding and extending from both ends, wherein the mechanical supporters are fixed to the corresponding ends of the first lens cap, respectively, to hold the first and second lens caps together and provide a space between the first and second lens caps.

2. A lamp cover structure according to claim 1, wherein the first and second lens caps are made from glass, PC, PMMA, and silicone,
wherein the first and second lens caps have a concave-convex shape and look like a portion of spherical shell.

3. A lamp cover structure according to claim 1, wherein the luminescent material is comprised of one or more phosphors that produce a different wavelength of visible light under an excitation source,
wherein the excitation source is a violet, and/or blue, and/or green, and/or yellow, or UV light emitting device.

4. A lamp cover structure containing luminescent material according to claim 1, wherein its fabrication method is as follows:
 a. the said first lens cap and the said second lens cap are pre-made by using injection molding;
 b. a proper amount of encapsulating material mixed with luminescent material is dispensed into the said first lens cap;
 c. the said second lens cap is mechanically fitted into the said first lens cap by using a mechanical holder;
 d. the said encapsulating material is solidified by heating or UV radiation to form the said encapsulating layer.

5. A lamp cover structure containing luminescent material according to claim 1, wherein its fabrication method is as follows:
 a. the first lens cap and the second lens cap are pre-made by using injection molding;
 b. the said second lens cap is mechanically fitted into the said first lens cap by using the mechanical supporters designed on the two caps and a fast-curing adhesive to form a space between the two lens caps;
 c. a silicone encapsulating material mixed with luminescent material is dispensed into the space to fill the space;
 d. the said silicone encapsulating material is solidified by heating or UV radiation to form the said encapsulating layer.

6. A lamp cover structure comprising:
 a first lens cap providing an outer surface of the lamp cover;
 a second lens cap providing an inner surface of the lamp cover;
 a encapsulating layer including luminescent material sandwiched between the first lens cap and the second lens cap; and
 the second lens cap including mechanical supporters protruding and extending from both ends, wherein the mechanical supporters are fixed to the corresponding ends of the first lens cap, respectively, to hold the first and second lens caps together.

7. A lamp cover structure according claim 6, wherein the mechanical supporters provide a space between the first and second lens caps.

8. A lamp cover structure comprising:
 a first lens cap providing an outer surface of the lamp cover;
 a second lens cap providing an inner surface of the lamp cover;
 a encapsulating layer including luminescent material sandwiched between the first lens cap and the second lens cap; and
 the second lens cap including mechanical supporters protruding and extending from both ends, wherein the mechanical supporters are fixed to the corresponding ends of the first lens cap, respectively, to hold the first and second lens caps together and wherein the mechanical supporters extend away from each other along the same plane.

* * * * *